(12) United States Patent
Yoshida et al.

(10) Patent No.: US 6,876,680 B2
(45) Date of Patent: Apr. 5, 2005

(54) SEMICONDUCTOR LASER DEVICE, SEMICONDUCTOR LASER MODULE, AND OPTICAL FIBER AMPLIFIER

(75) Inventors: Junji Yoshida, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 309 days.

(21) Appl. No.: 10/259,477

(22) Filed: Sep. 30, 2002

(65) Prior Publication Data

US 2003/0072342 A1 Apr. 17, 2003

(30) Foreign Application Priority Data

Sep. 28, 2001 (JP) ........................................ 2001-301992

(51) Int. Cl.[7] .............................. H01S 3/30; H01S 3/10; H01S 5/00; H01S 3/14; H01S 3/08
(52) U.S. Cl. ................................ 372/27; 372/3; 372/9; 372/43; 372/68; 372/102
(58) Field of Search ............................ 372/3, 9, 29.022, 372/32, 43, 45, 46, 49, 50, 68, 96, 102, 27

(56) References Cited

U.S. PATENT DOCUMENTS

6,384,963 B2    5/2002   Ackerman et al.

*Primary Examiner*—Minsun Oh Harvey
*Assistant Examiner*—Armando Rodriguez
(74) *Attorney, Agent, or Firm*—Oblon, Spivak, McClelland, Maier & Neustadt, P.C.

(57) ABSTRACT

A compressive strain GRIN-SCH-MQW active layer and a tensile strain GRIN-SCH-MQW active layer are laminated, and there are provided a diffraction grating formed in the vicinity of the compressive strain GRIN-SCH-MQW active layer and a diffraction grating formed in the vicinity of the tensile strain GRIN-SCH-MQW active layer, between the radiation end face and the reflection end face of the laser beam. A laser beam obtained by polarization-multiplexing a laser beam in the TE mode generated in the compressive strain GRIN-SCH-MQW active layer and a laser beam in the TE mode generated in the tensile strain GRIN-SCH-MQW active layer, and having a plurality of oscillation longitudinal modes of not larger than a predetermined output value is output by the wavelength selection characteristic of the diffraction gratings.

13 Claims, 7 Drawing Sheets

SEMICONDUCTOR LASER DEVICE, SEMICONDUCTOR LASER MODULE, AND OPTICAL FIBER AMPLIFIER

FIELD OF THE INVENTION

The present invention relates to a semiconductor laser device having a semiconductor laser element which outputs a laser beam having a plurality of oscillation longitudinal modes, a semiconductor laser module and an optical fiber amplifier.

BACKGROUND OF THE INVENTION

Recently, with rapid popularization of the Internet and a rapid increase of connections between LANs within industry, not only the number of outgoing calls for communication is increasing, but also the capacity of transmitted contents data is increasing as in motion pictures, thereby causing a problem in a rapid increase in data traffic. Therefore, the WDM (Wavelength Division Multiplex Transmission) system has achieved remarkable development and becomes widespread, in order to prevent the communication performance from decreasing due to an increase in the data traffic.

In the WDM system, a plurality of optical signals are respectively put on different wavelengths, thereby realizing large-capacity transmission 100 times as large as the conventional transmission, only by one fiber. Particularly, the existing WDM system uses an erbium-doped fiber amplifier (hereinafter referred to as EDFA), thereby enabling broadband and long distance transmission. The EDFA is an optical fiber amplifier which employs the principle that when light is made to passes through a special optical fiber doped with an element called erbium by an excitation laser of a wavelength of 1480 nm or a wavelength of 980 nm, the light in the wavelength range of 1550 nm, which is a transmission signal, is amplified in the special fiber.

On the other hand, the EDFA is a centralized optical amplifier in which portions exciting an optical signal are centralized, and has a limitation in that there is a loss of a transmission line optical fiber that leads to accumulation of noises, and non-linearity that causes distortion or noise in signals. Further, the EDFA enables optical amplification in a wavelength range which is determined by the bandgap energy of erbium, and hence it is difficult to make the bandwidth wide in order to realize further multiplexing.

Therefore, as an optical fiber amplifier which replaces the EDFA, a Raman amplifier is in the spotlight. The Raman amplifier is a distribution type optical amplifier which does not require a special fiber such as erbium-doped fiber as in the EDFA, and uses a normal transmission line fiber as a gain medium. Hence, the Raman amplifier has a characteristic in that it can realize a transmission band which is a broad band and has a flat gain, as compared with the conventional WDM transmission system using the EDFA as the base.

Figure 9:
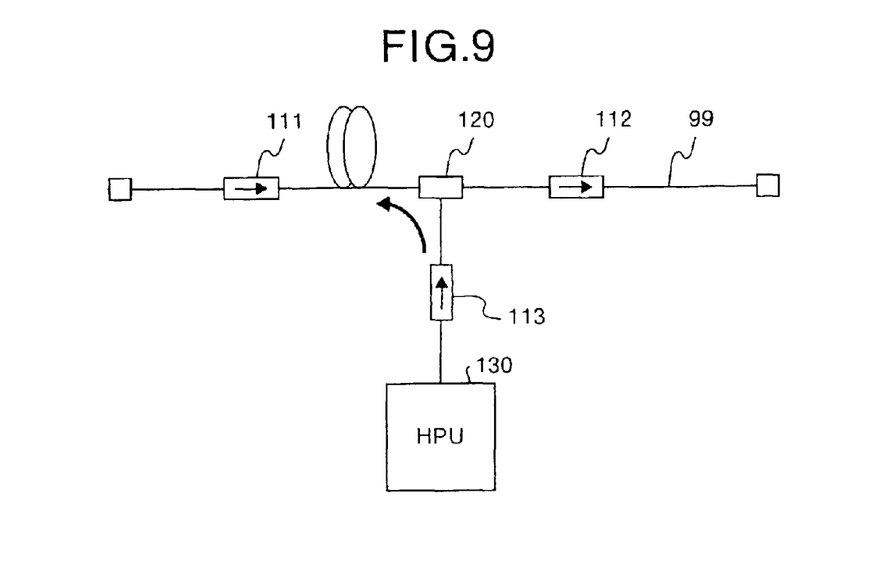
FIG. 9 is a block diagram which shows the schematic construction of a conventional Raman amplifier.

FIG. 9 is a block diagram which shows the schematic construction of a conventional Raman amplifier. In FIG. 9, the Raman amplifier comprises an optical coupler 120 provided on a transmission line 99, optical isolators 111 to 113, and a high-power pumping unit (HPU) 130.

Figure 10:
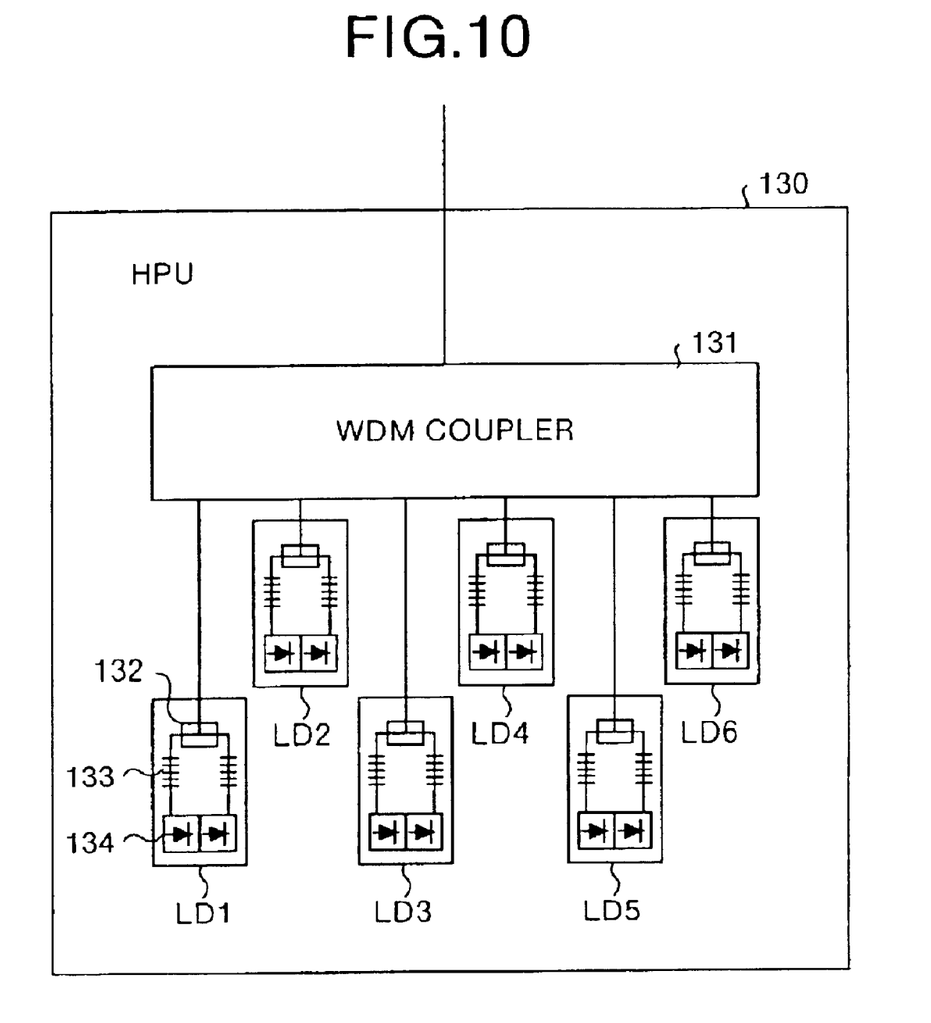
FIG. 10 is a diagram which shows the configuration example of the HPU in the conventional Raman amplifier.

FIG. 10 is a diagram which shows a configuration example of the HPU 130. In FIG. 10, the HPU 130 comprises six laser units LD1 to LD6 having different oscillation center wavelengths, and a Mach-Zehnder type WDM coupler 131. Respective laser units LD1 to LD6 have two Fabry-Perot semiconductor laser modules 134 having same oscillation center wavelengths, so that the laser outputs from respective semiconductor laser modules 134 are wavelength-stabilized by a fiber Bragg grating (FBG) 133, and coupled by a polarization beam combiner (PBC) 132 to thereby form one output.

The polarization multiplex by this PBC 132 is a measure which increases the output power of each oscillation center wavelength and reducing the polarization dependency of the Raman gain. Specifically, by using the polarization multiplex, a laser beam in the TE mode and a laser beam in the TM mode, which have the same wavelength, can be mulchplexed without any interference, thereby enabling a reduction in an optical loss.

In this manner, the HPU 130 needs to perform amplification over the multiplexed signal lights having a plurality of wavelengths (channels), and hence is composed of a plurality of laser units having different oscillation center wavelengths. The laser outputs from the respective laser units LD1 to LD6 are coupled by a WDM coupler 131 and output as a high-output multiplexed exciting light. The exciting light output from the HPU 130 passes through the optical fiber, which is the transmission line 99, through the optical coupler 120. In FIG. 9, there is shown an example of rear side excitation, wherein the exciting light coupled by the optical coupler 120 passes through the inside of the transmission line 99 towards the direction opposite to that of the signal light.

Since the high-output exciting light passes through the inside of the transmission line 99, based on the material characteristic of the optical fiber as a transmission media, the Raman scattered light occurs in the wavelength region shifted to the longer wavelength side than the exciting light by about 110 nm, and the energy of the exciting light is changed to a signal light through an induced Raman scattering process. As a result, the signal light is amplified.

As described above, the Raman amplifier is an amplifier which can use an existing optical fiber as an amplification medium, to directly amplify the signal light. It is different from the EDFA in terms of the amplification medium, the number of used excitation light sources, and the excitation power. In the EDFA, for a light source which excites the erbium-doped fiber, one having the same construction as that of the HPU 130 can be used.

For the Raman amplifier, in addition to the rear side excitation method in which a signal light is excited from the rear side, as in the Raman amplifier shown in FIG. 9, there are a front side excitation method in which the signal light is excited from the front side, and a bi-directional excitation method in which the signal light is excited bi-directionally. The one mainly used as the Raman amplifier at present is the rear side excitation method shown in FIG. 10. The reason is that the front side excitation method in which a weak signal light progresses in the same direction together with the strong exciting light has a problem in that the excited optical power fluctuates. Therefore, it is desired to develop as table excitation light source also applicable to the front side excitation method. That is to say, if a semiconductor laser module using the conventional fiber grating is used, there is a problem in that the applicable excitation method is limited.

The Raman amplification in the Raman amplifier is based on a condition that a polarization direction of the signal light coincides with a polarization direction of the exciting light. That is to say, the Raman amplification has a polarization dependency of the amplified gain, and it is necessary to reduce the influence caused by a deviation between the polarization direction of the signal light and the polarization direction of the exciting light. In the instance of the rear side excitation method, the signal light has no problem since the polarization becomes random during propagation. In the instance of the front side excitation method, however, the polarization dependency is strong, and it is necessary to reduce the polarization dependency by means of cross polarization multiplex, depolarization or the like of the exciting light. That is, it is necessary to reduce the degree of polarization (DOP).

Further, with the Raman amplification, the obtained optical gain is relatively low. Hence, a high output excitation light source for Raman amplification has been desired.

SUMMARY OF THE INVENTION

It is an object of this invention to provide a semiconductor laser device and a semiconductor laser module which can stably obtain a high output, while reducing the DOP, and an optical fiber amplifier.

According to one aspect of the present invention, there is provided a semiconductor laser device comprises, a compressive strain quantum well active layer, a tensile strain quantum well active layer, and a diffraction grating formed between a radiation end face and a reflection end face of a laser beam, and in the vicinity of the compressive strain quantum well active layer and/or the tensile strain quantum well active layer, wherein a laser beam obtained by polarization-multiplexing a laser beam in the TE mode generated in the compressive strain quantum well active layer and a laser beam in the TE mode generated in the tensile strain quantum well active layer, and having a plurality of oscillation longitudinal modes of not larger than a predetermined output value is output by the wavelength selection characteristic of the diffraction grating.

According to this aspect, a laser beam obtained by polarization-multiplexing the laser beam in the TE mode generated in the compressive strain quantum well active layer and the laser beam in the TE mode generated in the tensile strain quantum well active layer can be output in a plurality of oscillation longitudinal modes of not larger than a predetermined output value, such as a threshold at which induced Brillouin scattering occurs.

According to another aspect of the present invention, there is provided a semiconductor laser module comprising the semiconductor laser device described above, an optical fiber which wave-guides the laser beam emitted from the semiconductor laser device to the outside, and an optical coupling lens system which optically couples the semiconductor laser device and the optical fiber.

According to this aspect, the above-described semiconductor laser device can be provided in a package housing, and a low-DOP module can be realized.

Further, according to still another aspect of the present invention, there is provided an optical fiber amplifier comprising an excitation light source which outputs an exciting light obtained by coupling a plurality of laser beams having different oscillation center wavelengths, and performs amplification in a desired amplification band which is determined by the exciting light and at a desired gain, with respect to a signal light propagating on a transmission line, wherein the excitation light source has the above-described semiconductor laser module.

According to this aspect, the above-described semiconductor laser module can be used as an excitation light source for the EDFA and the Raman amplifier.

Other objects and features of this invention will become understood from the following description with reference to the accompanying drawings.

DETAILED DESCRIPTIONS

The preferred embodiments of the semiconductor laser device, the semiconductor laser module and the optical fiber amplifier according to this invention will now be explained in detail, with reference to the accompanying drawings. However, the present invention is not limited by those embodiments.

(First Embodiment)

At first, a first embodiment of the present invention will be explained. In the semiconductor laser device according to the first embodiment, polarization multiplex of the TE mode laser beam and the TM mode laser beam is performed in a package, by laminating two kinds of active layers, that is, a compressive strain quantum well active layer and a tensile strain quantum well active layer, thereby outputting a laser beam having a large output power at a low cost.

Figure 1:
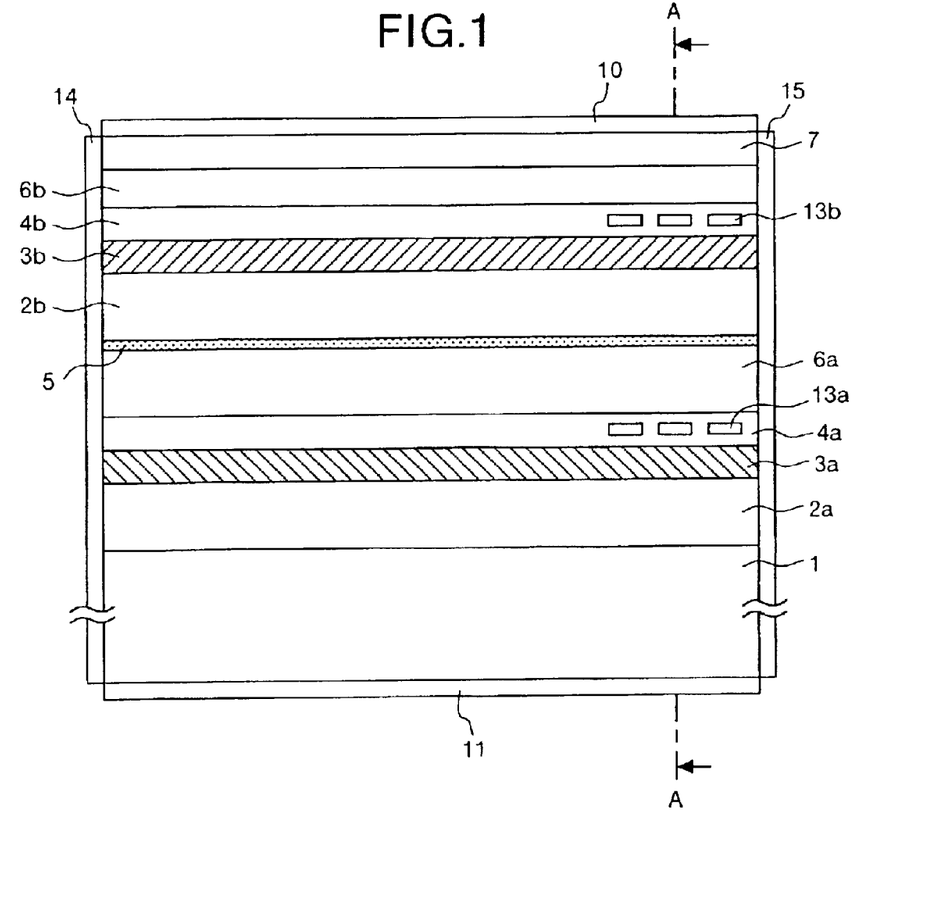
FIG. 1 is a longitudinal sectional view in the longitudinal direction of a semiconductor laser device according to a first embodiment.
Figure 2:
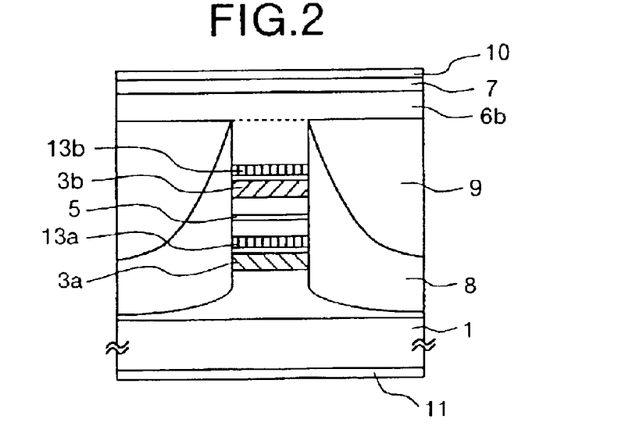
FIG. 2 is a sectional view of the semiconductor laser element shown in FIG. 1 taken along the line A—A.

FIG. 1 is a longitudinal sectional view in the longitudinal direction of the semiconductor laser device according to the first embodiment. FIG. 2 is a sectional view of the semiconductor laser element shown in FIG. 1 taken along the line A—A. In FIG. 1, the semiconductor laser device according to the first embodiment is constructed by sequentially laminating on a plane (100) of an n-InP substrate 1, an n-InP buffer layer 2a combining a buffer layer and a lower cladding layer by means of n-InP, a compressive strain GRIN-SCH-MQW (Graded Index-Separate Confinement Heterostructure Multi Quantum Well) active layer 3a, a p-InP spacer layer 4a, a p-InP cladding layer 6a, a tunnel junction layer 5, an n-InP cladding layer 2b, a tensile strain GRIN-SCH-MQW active layer 3b, a p-InP spacer layer 4b and a p-InP cladding layer 6b.

On the p-InP cladding layer 6b, a p-InGaAsP cap layer 7 and a p-side electrode 10 are laminated in order, and on the back of the n-InP substrate 1, an n-side electrode 11 is formed.

As shown in FIG. 1, a reflection film 14 having a high optical reflectance of 80% or higher is formed on the light reflection end face, being one end face of the semiconductor laser device in the longitudinal direction, and a radiation side reflection film 15 having a reflectance of 2% or less, preferably a low optical reflectance of 1% or less is formed on the light radiation end face, being the other end face. The light generated in the compressive strain GRIN-SCH-MQW active layer 3a and the tensile strain GRIN-SCH-MQW active layer 3b of the optical resonator formed by the reflection film 14 and the diffraction gratings 13a, 13b including the radiation side reflection film 15 is reflected by the reflection film 14, and emitted as a laser beam through the radiation side reflection film 15.

Further, the semiconductor laser element shown in FIG. 1 has p-InGaAsP diffraction gratings 13a and 13b, periodically arranged in the p-InP spacer layers 4a and 4b, respectively. Particularly, these diffraction gratings 13a and 13b have a film thickness of 20 nm over the length of about 100 μm from the radiation end face, and are formed at a grating period of about 220 nm, so that light having a center wavelength of 1.48 μm is selected, of the laser beams generated in each gain region of the compressive strain GRIN-SCH-MQW active layer 3a and the tensile strain GRIN-SCH-MQW active layer 3b. The diffraction gratings 13a and 13b are desirably arranged from a position abutting against the radiation end face, but the position may not be necessarily the abutting position. The diffraction gratings 13a and 13b may be arranged at a position alienated from the central plane, within the range that can exert the function of the diffraction gratings 13a and 13b, for example, in the range of from 20 μm to 100 μm.

As shown in FIG. 2, the upper part of the n-InP buffer layer 2a, the compressive strain GRIN-SCH-MQW active layer 3a, the p-InP spacer layer 4a including the diffraction grating 13a, the p-InP cladding layer 6a, the tunnel junction layer 5, the n-InP cladding layer 2b, the tensile strain GRIN-SCH-MQW active layer 3b, and the p-InP spacer layer 4b including the diffraction grating 13b are formed into a mesa stripe shape, and the opposite sides of the mesa stripe are embedded by a p-InP blocking layer 8 and an n-InP blocking layer 9 formed as the current blocking layer.

Here, the strain quantum well will be explained briefly. A double heterostructure including a quantum well has been normally constructed by a combination of lattice-matched semiconductor compound crystals. However, a quantum well as thin as several tens nm or less can be constructed by a crystal composition having a slight lattice mismatch with the substrate. When the lattice constant of the well is larger than that of the substrate, the well becomes a strain quantum well having a compressive strain, and in the opposite instance, the well becomes a strain quantum well having a tensile strain.

A typical examples are an InGaAs well layer on GaAs substrate and an InGaAs or InGaAsP well layer on InP substrate, and in the former instance, the compressive strain type is obtained, and in the latter instance, the both types can be realized depending on the composition. Such a strain deforms the band structure of the quantum well, and hence can realize a useful characteristic of improving the performance of the semiconductor laser device by appropriate designing.

Particularly, in view of the band structure, in the instance of the compressive strain, the upper end of a heavy hole band becomes the upper end of a valence band, wherein the transition between electrons and the heavy holes is the main transition. It is known that this transition contributes to the oscillation of the laser beam mainly of the TE mode. On the other hand, in view of the band structure, in the instance of the tensile strain, the upper end of a light hole band becomes the upper end of the valence band, wherein the transition between electrons and the light holes is the main transition. It is known that this transition contributes to the oscillation of the laser beam mainly of the TM mode. Therefore, from the compressive strain GRIN-SCH-MQW active layer 3a shown in FIG. 1, the TE mode laser beam can be selectively emitted, and from the tensile strain GRIN-SCH-MQW active layer 3b, the TM mode laser beam can be selectively emitted.

The characteristics of this semiconductor laser device will now be explained. When the semiconductor laser device is used as an excitation light source for the Raman amplifier, the oscillation wavelength $\lambda_0$ thereof is set to be from 1100 nm to 1550 nm, and the length L of the resonator determined by the length between the reflection film 14 and the radiation side reflection film 15 is designated as from at least 800 μm to 3200 μm or less. In general, the mode interval $\Delta\lambda$ of the longitudinal mode generated by the resonator of the semiconductor laser device can be expressed by the following equation, assuming that the equivalent refractive index is "n". That is, $$\Delta\lambda = \lambda_0^2/(2 \cdot n \cdot L).$$

Here, if the oscillation wavelength $\lambda_0$ is designated as 1480 nm, and the effective refractive index is designated as 3.5, when the length L of the resonator is 800 μm, the mode interval $\Delta\lambda$ of the longitudinal mode becomes about 0.39 nm, and when the length L of the resonator is 3200 μm, the mode interval $\Delta\lambda$ of the longitudinal mode becomes about 0.1 nm. That is to say, as the length L of the resonator increases, the mode interval $\Delta\lambda$ of the longitudinal mode becomes narrower, and the selection condition of oscillating the laser beam of a single longitudinal mode becomes stricter.

Figure 3:
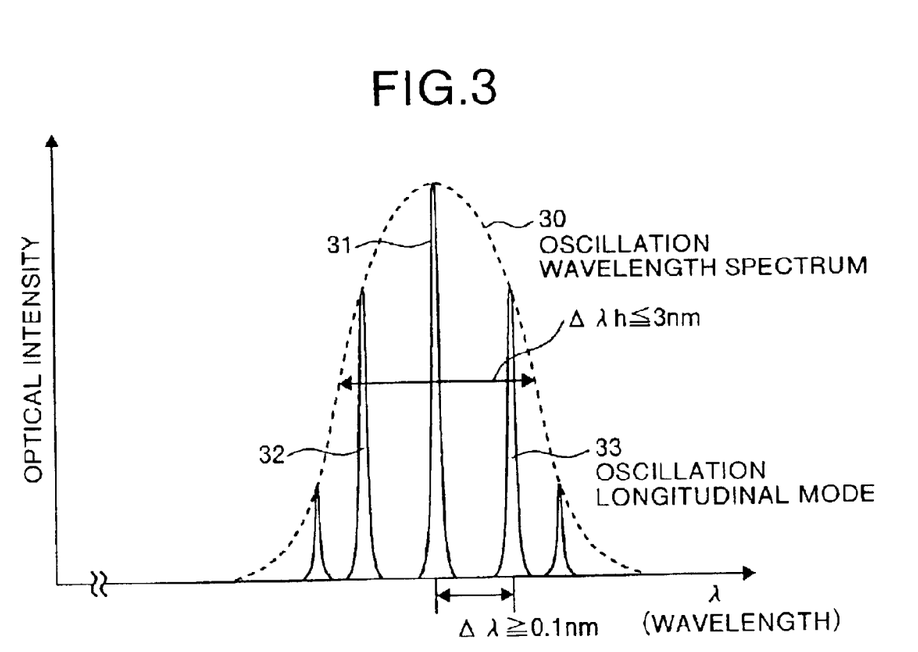
FIG. 3 is a graph which explains the selective wavelength characteristic by a diffraction grating of the semiconductor laser device according to the first embodiment.

On the other hand, the diffraction gratings 13a and 13b select the longitudinal mode by the Bragg wavelength. FIG. 3 is a graph which explains the selective wavelength characteristic by the diffraction gratings 13a and 13b. The selective wavelength characteristic by the diffraction gratings 13a and 13b is expressed as the oscillation wavelength spectrum 30 shown in the figure.

As shown in FIG. 3, this semiconductor laser device is designed such that a plurality of oscillation longitudinal modes exist in the wavelength selection characteristic indicated by the half band width $\Delta\lambda h$ of the oscillation wavelength spectrum 30 by means of the existence of the diffraction gratings 13a and 13b. With the conventional semiconductor laser device, if the length L of the resonator is designated as 800 μm or larger, single longitudinal mode oscillation has been difficult, and hence a semiconductor laser device having such a length L of the resonator has not been used. With the semiconductor laser device, however, by positively making the length L of the resonator 800 μm or larger, a laser beam including a plurality of oscillation longitudinal modes in the half band width $\Delta\lambda h$ of the oscillation wavelength spectrum is output. In FIG. 3, there are three oscillation longitudinal modes 31 to 33 in the half band width $\Delta\lambda h$ of the oscillation wavelength spectrum.

Figure 4A:
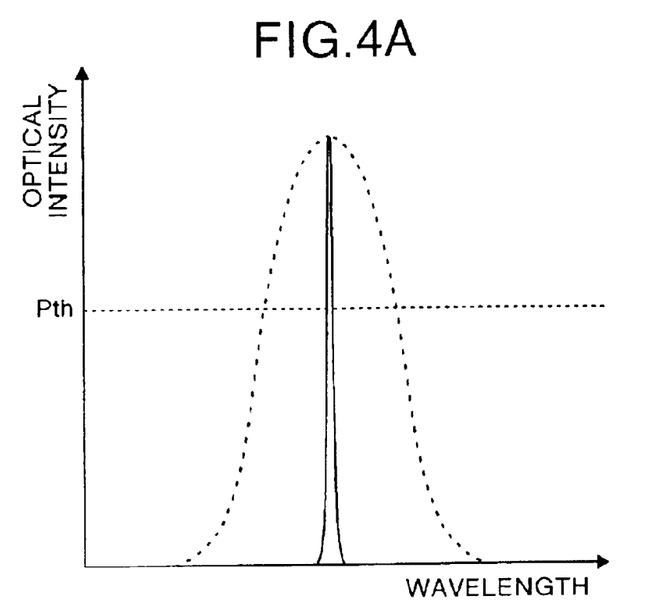
FIGS. 4A and 4B are diagram which explains each profile of a laser beam having a single longitudinal mode and a laser beam having a plurality of oscillation longitudinal modes according to the first embodiment.
Figure 4B:
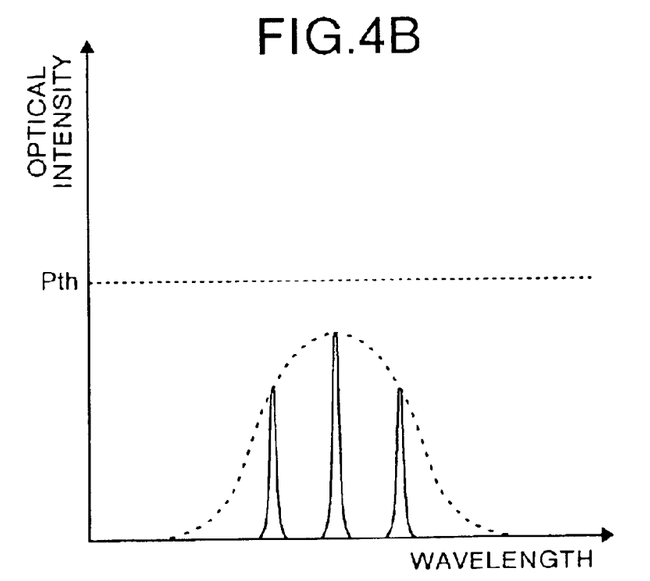

When a laser beam having a plurality of oscillation longitudinal modes is used, the peak value of the laser output is suppressed, and a high laser output value can be obtained, as compared with an instance in which a laser beam of a single longitudinal mode is used. FIG. 4A and FIG. 4B are diagram which explains each profile of a laser beam having a single longitudinal mode and a laser beam having a plurality of oscillation longitudinal modes. For example, the above-described semiconductor laser element section has a profile shown in FIG. 4B, and a high laser output can be obtained with a low peak value. On the contrary, FIG. 4A shows a profile of a semiconductor laser element section having a single longitudinal mode oscillation when the same laser output is to be obtained, and has a high peak value.

When the semiconductor laser device according to the first embodiment is used as the excitation light source for the Raman amplifier, it is desired to increase the output power of the exciting light in order to increase the Raman gain. However, if the peak value is high, induced Brillouin scattering occurs to thereby increase noise as shown in FIG. 4A. The induced Brillouin scattering occurs when the laser output exceeds a threshold Pth at which the induced Brillouin scattering occurs. When the same laser output power as that of the profile shown in FIG. 4A is to be obtained, as shown in FIG. 4B, a laser beam is emitted in a plurality of oscillation longitudinal modes in which the peak value is suppressed to not larger than the threshold Pth of the induced Brillouin scattering. Thereby, a high output power of the exciting light can be obtained, and as a result, a high Raman gain can be obtained.

In FIG. 3, the wavelength interval (mode interval) $\Delta\lambda$ between the oscillation longitudinal modes 31 to 33 is made to be 0.1 nm or larger. This is because when this semiconductor laser device is used as the excitation light source for the Raman amplifier, if the mode interval $\Delta\lambda$ is not larger than 0.1 nm, there is a high possibility that the induced Brillouin scattering may occur. As a result, it is preferable that the length L of the resonator described above be 3200 $\mu$m or less, from the equation of the mode interval $\Delta\lambda$. From this point of view, the number of oscillation longitudinal modes included within the half band width $\Delta\lambda h$ of the oscillation wavelength spectrum 30 is desirably plural.

As described above, in the semiconductor laser device according to the first embodiment, the positions of the diffraction grating 13a and 13b to be arranged and the length L of the resonator are set so that at least two oscillation longitudinal modes are included within the half band width $\Delta\lambda h$ of the oscillation wavelength spectrum. Hence, stable and high power laser output can be obtained without causing the induced Brillouin scattering.

In the structure shown in FIG. 1, the p-InP cladding layer 6b, the tensile strain GRIN-SCH-MQW active layer 3b, and the n-InP cladding layer 2b are sequentially biased in the forward direction by the current applied to between the p-side electrode 10 and the n-side electrode 11, and the TM mode laser beam is emitted from the tensile strain GRIN-SCH-MQW active layer 3b. However, since the connection between the n-InP cladding layer 2b and the p-InP cladding layer 6a, which are located in the lower layer of the tensile strain GRIN-SCH-MQW active layer 3b, becomes reverse bias, if these layers are directly joined, the current is not injected to the compressive strain GRIN-SCH-MQW active layer 3a in the lower layer.

Therefore, as shown in FIG. 1, the tunnel junction layer 5 is provided between the n-InP cladding layer 2b and the p-InP cladding layer 6a. Thereby, the tunneling current is made to flow effectively from the n-InP cladding layer 2b to the tunnel junction layer 5, and through the tunnel junction layer 5, the forward bias current can be made to flow to the p-InP cladding layer 6a, the compressive strain GRIN-SCH-MQW active layer 3a, and the n-InP buffer layer 2a. The tunnel junction layer 5 can be formed, for example, by an n-type or p-type semiconductor in which impurities are doped in high concentration.

As a result, the laser beams in the TM mode and the TE mode are emitted from the radiation side reflection film 15, which is the radiation end face. However, since the positions of the radiation ends in the compressive strain GRIN-SCH-MQW active layer 3a and the tensile strain GRIN-SCH-MQW active layer 3b are close to each other, a high power laser beam in the state with the both of these active layers being multiplexed without interference can be obtained from this semiconductor laser device.

That is to say, this semiconductor laser device can output a polarization-multiplexed high power laser beam, without using a polarization multiplexer. In other words, this semiconductor laser device can output a laser beam in which the DOP is reduced by cross polarization multiplex.

As explained above, according to the semiconductor laser device according to the first embodiment, in a semiconductor laser device which outputs a laser beam including a plurality of oscillation longitudinal modes of not larger than a threshold at which the induced Brillouin scattering occurs, polarization multiplex of the TE mode laser beam and the TM mode laser beam is performed by laminating two kinds of active layers, that is, the compressive strain quantum well active layer and the tensile strain quantum well active layer. As a result, a laser beam in which the DOP is reduced and having a large output can be emitted.

Although the invention has been described with respect to a specific embodiment for a complete and clear disclosure, claims are not to be thus limited.

We claim a semiconductor device having no diffraction grating 13a and no diffraction grating 13b of FIG. 1.

(Second Embodiment)

A semiconductor laser device according to a second embodiment will now be explained. In the semiconductor laser device according to the second embodiment, a compressive strain quantum well active layer and a tensile strain quantum well active layer are continuously laminated, and one set of cladding layers is provided with respect to the laminated portion, different from the first embodiment which has the independent compressive strain quantum well active layer and tensile strain quantum well active layer, putting the cladding layer therebetween.

Figure 5:
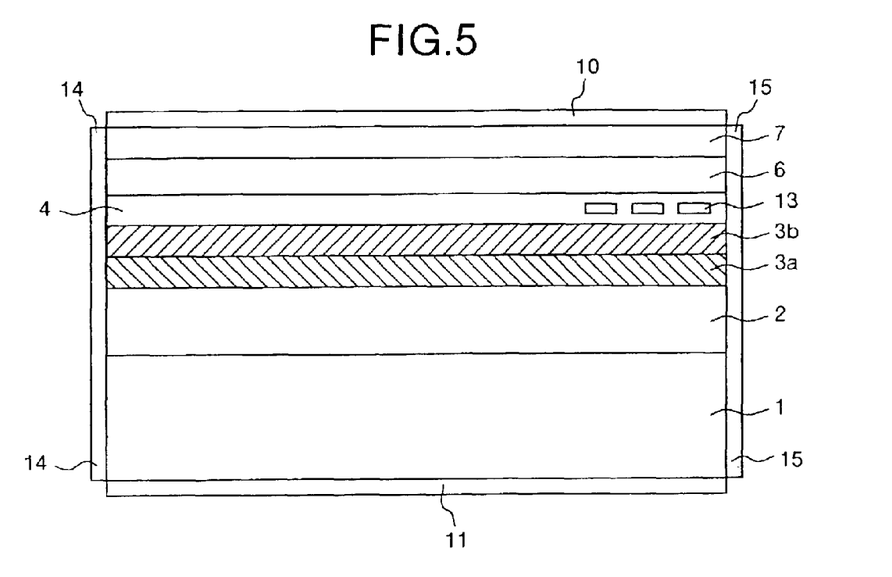
FIG. 5 is a longitudinal sectional view in the longitudinal direction of a semiconductor laser device according to a second embodiment.

FIG. 5 is a longitudinal sectional view in the longitudinal direction of the semiconductor laser device according to the second embodiment. In FIG. 5, the parts common to FIG. 1 are denoted by the same reference symbols, and the explanation thereof is omitted. In the semiconductor laser device shown in FIG. 5, the point different from FIG. 1 is that the n-InP buffer layer 2b, the tunnel junction layer 5, the p-InP cladding layer 6a and the p-InP spacer layer 4a between the tensile strain GRIN-SCH-MQW active layer 3b and the compressive strain GRIN-SCH-MQW active layer 3a are eliminated, so that the tensile strain GRIN-SCH-MQW active layer 3b and the compressive strain GRIN-SCH-MQW active layer 3a are put adjacent to each other.

That is to say, the semiconductor laser device according to the second embodiment is constructed by sequentially laminating on a plane (100) of an n-InP substrate 1, an n-InP buffer layer 2 combining a buffer layer and a lower cladding layer by means of n-InP, a compressive strain GRIN-SCH-MQW active layer 3a, a tensile strain GRIN-SCH-MQW active layer 3b, a p-InP spacer layer 4 and a p-InP cladding layer 6. The sectional view of the semiconductor laser device according to the second embodiment has an embedded Heterostructure in which the opposite sides are embedded by a blocking layer, as shown in FIG. 2.

Therefore, in this semiconductor laser device, the compressive strain GRIN-SCH-MQW active layer 3a and the tensile strain GRIN-SCH-MQW active layer 3b which are laminated vertically adjacent to each other are regarded as one active layer, and this active layer is put between the cladding layers. Thereby, a high power laser beam obtained by polarization-multiplexing a TM mode laser beam and a TE mode laser beam is output in the same manner as in the first embodiment. Similar to FIG. 1, the p-InP spacer layer 4 is provided between the tensile strain GRIN-SCH-MQW active layer 3b and the p-InP cladding layer 6, and a diffraction grating 13 is formed in the p-InP spacer layer 4, under the conditions explained in the first embodiment. Hence, the laser beam output from this semiconductor laser device has a plurality of oscillation longitudinal modes.

As explained above, according to the semiconductor laser device in the second embodiment, by having such a construction that the compressive strain quantum well active layer and the tensile strain quantum well active layer are continuously laminated, and one set of cladding layers is provided with respect to the laminated portion, the effect similar to the first embodiment can be obtained.

(Third Embodiment)

A semiconductor laser device according to a third embodiment will now be explained. Different from the first and second embodiments in which the compressive strain quantum well active layer and the tensile strain quantum well active layer are laminated vertically, in the semiconductor laser device according to the third embodiment, the both active layers are butt-joined in the radiation direction.

Figure 6:
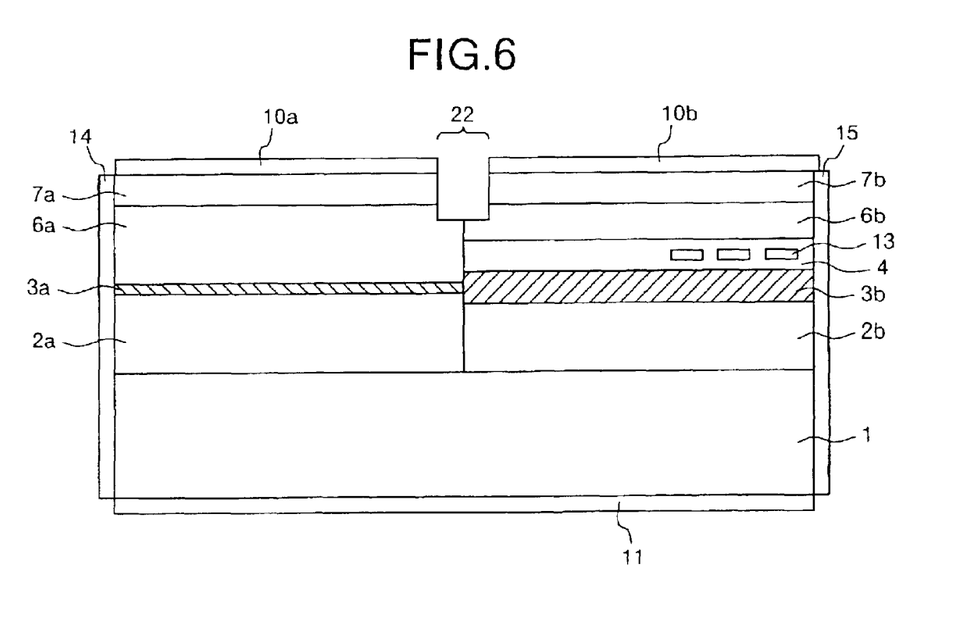
FIG. 6 is a longitudinal sectional view in the longitudinal direction of a semiconductor laser device according to a third embodiment.

FIG. 6 is a longitudinal sectional view in the longitudinal direction of the semiconductor laser device according to the third embodiment. The semiconductor laser device shown in FIG. 6 has the construction in which a laminated structure comprising an n-InP buffer layer 2a, a compressive strain GRIN-SCH-MQW active layer 3a and a p-InP cladding layer 6a, and a laminated structure comprising an n-InP cladding layer 2c, a tensile strain GRIN-SCH-MQW active layer 3b, a p-InP spacer layer 4b and a p-InP cladding layer 6b are so-called butt-joined, on a plane (100) of an n-InP substrate 1.

Particularly in this butt joint, at least the compressive strain GRIN-SCH-MQW active layer 3a and the tensile strain GRIN-SCH-MQW active layer 3b are arranged so as to be one link. Thereby, the TE mode laser beam generated in the compressive strain GRIN-SCH-MQW active layer 3a passes through the tensile strain GRIN-SCH-MQW active layer 3b, and is emitted to the outside in the state of being polarization-multiplexed with the TM mode laser beam generated in the tensile strain GRIN-SCH-MQW active layer 3b.

A p-InGaAsP cap layer 7a and a p-side electrode 10a are sequentially laminated on the p-InP cladding layer 6a, and a p-InGaAsP cap layer 7b and a p-side electrode 10b are sequentially laminated on the p-InP cladding layer 6b. Further, as shown in the figure, a separation groove 22 is formed at a boundary portion between the set of the p-InGaAsP cap layer 7a and the p-side electrode 10a and the set of the p-InGaAsP cap layer 7b and the p-side electrode 10b. By this separation groove 22, the both sets are arranged substantially in the electrically insulated state. An n-side electrode 11 is formed on the back of the n-InP substrate 1.

That is to say, the output power of the TE mode laser beam generated in the compressive strain GRIN-SCH-MQW active layer 3a can be adjusted by a current injected from the p-side electrode 10a to the n-side electrode 11. Also, the output power of the TM mode laser beam generated in the tensile strain GRIN-SCH-MQW active layer 3b can be adjusted by a current injected from the p-side electrode 10b to the n-side electrode 11.

Alternatively, the construction may be such that the separation groove 22 is not provided, and the p-InGaAsP cap layers 7a and 7b are made one p-InGaAsP cap layer, and on the p-InGaAsP cap layer, one p-side electrode is provided instead of the p-side electrodes 10a and 10b, so that always the same injected current is provided with respect to the compressive strain GRIN-SCH-MQW active layer 3a and the tensile strain GRIN-SCH-MQW active layer 3b.

As shown in FIG. 2, the cross section of the semiconductor laser device according to the third embodiment becomes an embedded Heterostructure with the opposite sides embedded by a blocking layer. Since the diffraction grating 13 is formed in the p-InP spacer layer 4, under the condition explained in the first embodiment, the laser beam output from this semiconductor laser device has a plurality of oscillation longitudinal modes.

As explained above, according to the semiconductor laser device in the third embodiment, the same effects as in the first embodiment can be expected by butt-joining the compressive strain quantum well active layer and the tensile strain quantum well active layer in the radiation direction.

In the first to third embodiments, the number of pairs of the compressive strain GRIN-SCH-MQW active layers 3a and the number of pairs of the tensile strain GRIN-SCH-MQW active layers 3b are not necessarily the same, and may be different so that the laser beam in each mode can be output most suitably. According to the present invention, two or more of the desired oscillation longitudinal modes are included in the half-width of the oscillation wavelength spectrum, based on the wavelength selection characteristic of the diffraction grating. With this arrangement, a high-output laser beam is output. Therefore, there is an effect that even when the semiconductor laser device has a high output, it is possible to stably and efficiently output the oscillation wavelength selected by the diffraction grating.

According to the present invention, the diffraction grating provided on the side of the first reflection film has a diffraction grating length of 300 $\mu$m or less. Therefore, there is an effect that two or more oscillation longitudinal modes can be easily generated, and the optical output efficiency can be improved.

According to the present invention, the diffraction grating provided on the side of the first reflection film has a diffraction grating length less than a value of (300/1300) times the resonator length. Therefore, there is an effect that even when the resonator has an optional length, two or more oscillation longitudinal modes can be easily generated, and the optical output efficiency can be improved for high power operation.

According to the present invention, the multiplication value of the diffraction grating obtained by multiplying a coupling coefficient of the diffraction grating by the diffraction grating length is 0.3 or less. Therefore, the linearity of the driving current-optical output characteristic becomes excellent, and the stability of the optical output is enhanced. As a result, there is an effect that it is possible to reduce the driving current dependency of the oscillation wavelength, and it is possible to realize a semiconductor laser device having high output stability.

According to the present invention, the grating period of the diffraction grating is varied at random or in a predetermined period, so that fluctuations are made to occur in the wavelength selection of the diffraction grating, and the half-width of the oscillation wavelength spectrum is widened. Therefore, there is an effect that it is possible to easily increase the number of oscillation longitudinal modes included in the half-width of the oscillation wavelength spectrum, and it is possible to realize a stable and highly efficient semiconductor laser device.

According to the present invention, the length of the resonator formed by the active layer formed between the first reflection film and the second reflection film is 800 μm or more, and high output operation is realized. Therefore, there is an effect that it is possible to realize high output operation, and stably and highly efficiently output oscillation wavelength selected by the diffraction grating.

According to the present invention, the semiconductor laser device which does not use the fiber grating is used, and the resonator of the semiconductor laser device is not physically separated. Therefore, it is not necessary to align the optical axis. Thus it becomes easy to assemble the semiconductor laser module and oscillation characteristic of the laser is less prone to be changed by mechanical vibrations and the like. Therefore, there is an effect that it is possible to realize a semiconductor laser module that can output a stable laser beam reliably and stably, and at low cost.

According to the present invention, the semiconductor laser device which does not use the fiber grating is used. Therefore, there is an effect that it is possible to use a polarization dependent isolator, different from the in-line fiber type, and it is possible to realize a semiconductor laser module having a small insertion loss and small RIN.

(Fourth Embodiment)

A semiconductor laser module according to a fourth embodiment will now be explained. The semiconductor laser module is in a form of enclosing the semiconductor laser device according to the first to third embodiments in a package, together with various optical parts, and is adjusted so that a laser beam generated in the semiconductor laser device is easily coupled into an optical fiber.

Figure 7:
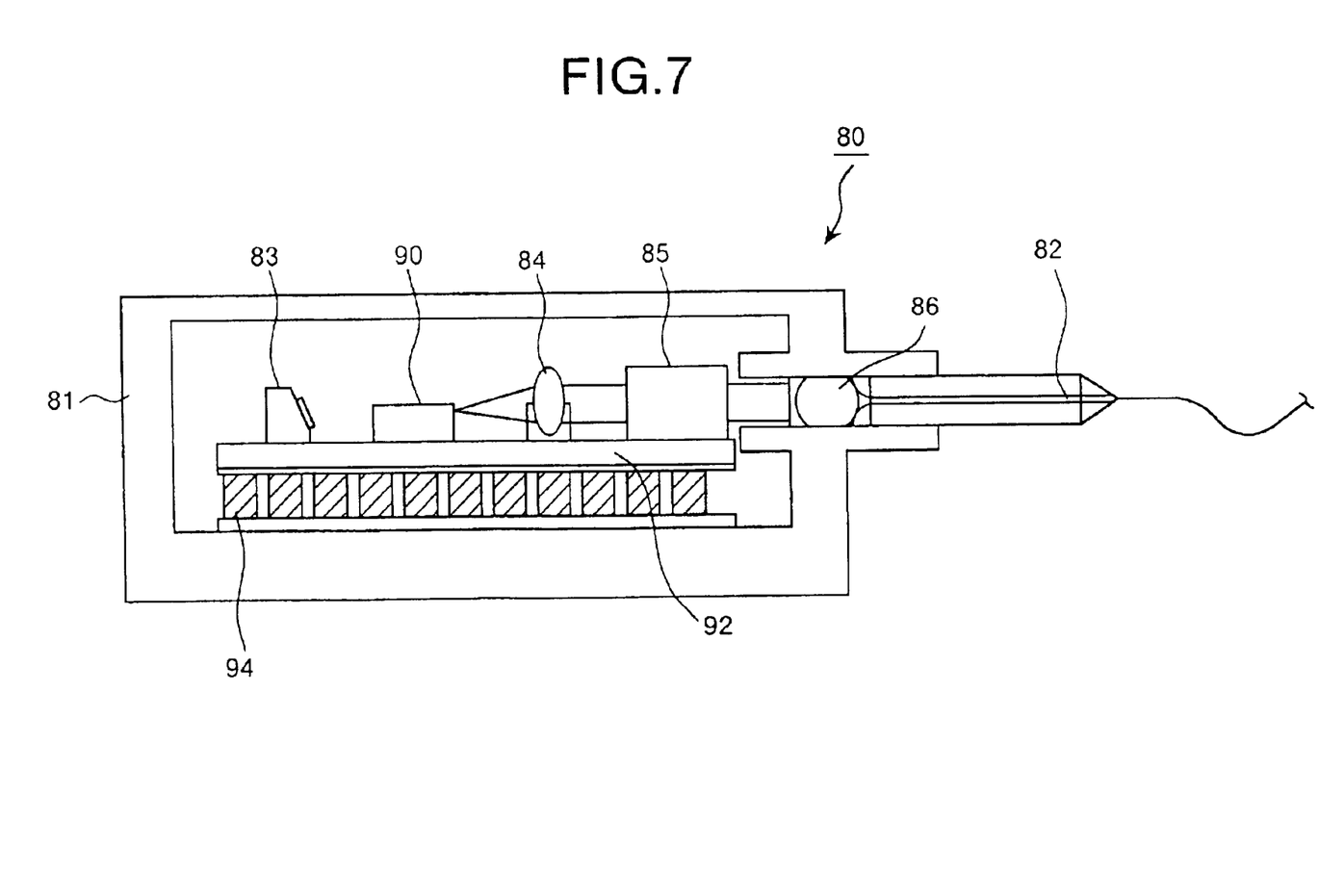
FIG. 7 is a longitudinal sectional view which shows the construction of a semiconductor laser module according to a fourth embodiment.

FIG. 7 is a longitudinal sectional view which shows the construction of the semiconductor laser module according to the fourth embodiment. In FIG. 7, in the semiconductor laser module 80, a Peltier element 94 is arranged on the inner bottom face of a package 81 formed of ceramics or the like. A base 92 is disposed on the Peltier element 94, and a semiconductor laser device 90 is disposed on this base 92. The semiconductor laser device 90 corresponds to the semiconductor laser devices shown in the first to the third embodiments.

In the structure formed by the Peltier element 94, the base 92 and the semiconductor laser device 90, an electric current (not shown) is applied to the Peltier element 94, and cooling or heating is effected by the polarity thereof, but it serves mainly as a cooler in order to prevent a deviation of the oscillation wavelength due to a temperature increase of the semiconductor laser device 90. That is to say, when the laser beam has a longer wavelength than a desired wavelength, the Peltier element 94 controls the semiconductor laser device at a low temperature by cooling, and when the laser beam has a shorter wavelength than the desired wavelength, it controls the semiconductor laser device at a high temperature by heating. This temperature control is performed based on a detection value of a thermistor (not shown) arranged in the vicinity of the semiconductor laser device 90. A control unit (not shown) normally controls the Peltier element 94 so as to maintain the temperature of the semiconductor laser device 90 constant. The control unit (not shown) also controls the Peltier element 94 so that the temperature of the semiconductor laser device 90 decreases with an increase of the driving current of the semiconductor laser device 90. By performing such temperature control, the wavelength stability of the semiconductor laser device 90 can be improved, thereby improving the yield.

In FIG. 7, on the base 92, there are arranged an optical monitor 83, a first lens 84 and an isolator 85, in addition to the semiconductor laser device 90. In the semiconductor laser module 80, a second lens 86 is arranged on the inner side where an optical fiber 82 is mounted.

The laser beam emitted from the semiconductor laser device 90 is waveguided into the optical fiber 82, through the first lens 84, the isolator 85 and the second lens 86. The second lens 86 is provided on the optical axis of the laser beam and on the package 81, and optically coupled to the optical fiber 82 that is externally connected. The optical monitor 83 monitors and detects light leaked from the reflection film side of the semiconductor laser device 90.

The isolator 85 between the semiconductor laser device 90 and the optical fiber 82 prevents that the reflected return light due to other optical parts returns to the resonator to become a stray light, and adversely affects the stable laser.

Figure 8:
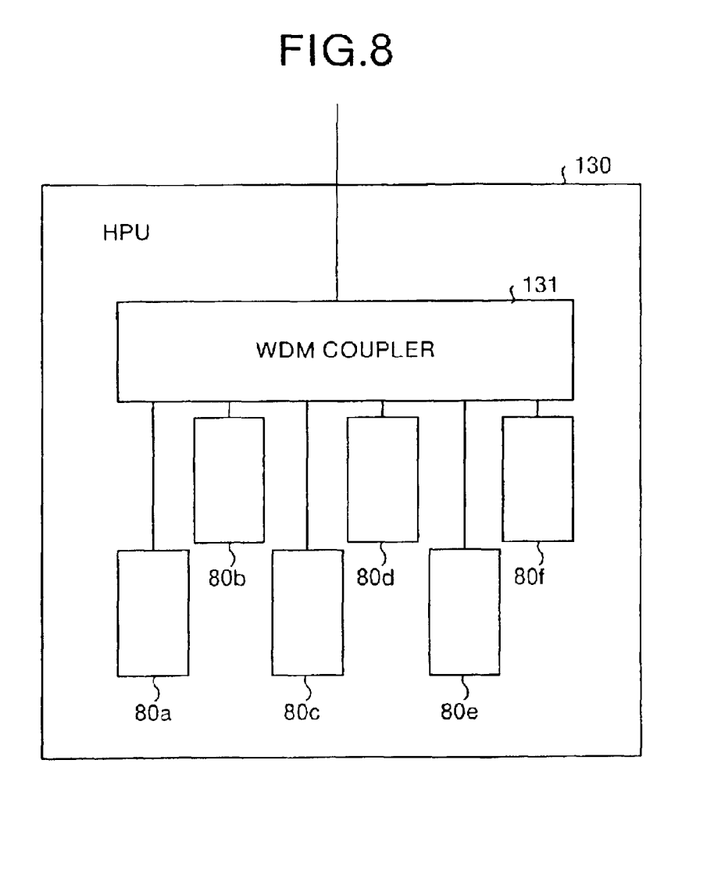
FIG. 8 is a diagram which explains the instance when the semiconductor laser module according to the fourth embodiment is used in the HPU which is used for the Raman amplifier and the EDFA.

FIG. 8 is a diagram which explains the instance when this semiconductor laser module is used in the HPU which is used for the Raman amplifier and the EDFA. In FIG. 8, 80a to 80f correspond to the semiconductor laser module 80 shown in FIG. 7. As explained above, the semiconductor laser devices according to the first to the third embodiments realize a reduction in the DOP without using a polarization multiplexer. Hence, the PBC 132 which is required in each laser unit shown in FIG. 10 can be eliminated, and the output power can be increased by an increase of the injected current. As a result, it is not necessary to provide a plurality of semiconductor laser modules 134 and a WDM coupler 131 in one laser unit which outputs a laser beam in the same wavelength. Further, the semiconductor laser devices according to the first to third embodiments can output a laser beam in a stable wavelength by including a diffraction grating therein, and hence the FBG 133 is not an essential element.

As explained above, according to the semiconductor laser module in the fourth embodiment, since the semiconductor laser devices according to the first to third embodiments are adjusted, a return light can be reduced by using a isolator, to thereby reduce the noise and promote a reduction in the number of parts.

In the fourth embodiment, there is shown an example in which the isolator 85 is provided in the module, but the isolator is not an essential element. Also, this embodiment includes a diffraction grating in the semiconductor laser element. However, in the instance of using the FBG, a semiconductor laser device which does not include a diffraction grating may be used.

In the first to fourth embodiments, there is explained the instance in which the oscillation wavelength $\lambda_0$ of the semiconductor laser device is 1480 nm, but it is needless to say that the present invention is applicable to the instance in which a semiconductor laser element section of for example 980 nm or other oscillation wavelength is provided. Further, it is needless to say that the present invention is applicable for not only the Raman amplifier but also the EDFA.

As explained above, according to one aspect of the present invention, in the semiconductor laser device which outputs a laser beam including a plurality of oscillation longitudinal modes of not larger than a threshold at which the induced Brillouin scattering occurs, the polarization multiplex of the TE mode laser beam and the TM mode laser beam is performed by laminating two kinds of active layers, i.e., the compressive strain quantum well active layer and the tensile strain quantum well active layer. Hence, there are the effects that the DOP can be reduced, and high power laser beam can be emitted.

According to another aspect of the present invention, in the semiconductor laser module, there is the effect that the semiconductor laser device can be provided in the state of being enclosed in a package housing.

According to still another aspect of the present invention, in the optical fiber amplifier, there is the effect that noise can be reduced and the number of parts can be also reduced, by using the semiconductor laser module as an excitation light source for the EDFA and the Raman amplifier.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device comprising:
    a compressive strain quantum well active layer;
    a tensile strain quantum well active layer;
    a resonator formed between a radiation end face and a reflection end face of a laser beam; and
    a diffraction grating formed between said radiation end face and said reflection end face, said diffraction grating being positioned in the vicinity of said compressive strain quantum well active layer and/or said tensile strain quantum well active layer, said diffraction grating being configured to select a laser beam having a plurality of oscillation longitudinal modes having a specific central wavelength, wherein said compressive strain quantum well active layer and said tensile strain quantum well active layer are arranged so that an output laser beam is obtained by polarization-multiplexing a laser beam in the TE mode generated in said compressive strain quantum well active layer and a laser beam in the TM mode generated in said tensile strain quantum well active layer.

2. The semiconductor laser device of claim 1 further comprising:
    cladding layers formed on upper and lower sides of said compressive strain quantum well active layer;
    cladding layers formed on upper and lower sides of said tensile strain quantum well active layer;
    a tunnel junction layer formed between one of said cladding layers formed on upper and lower sides of said compressive strain quantum well active-layer and one of cladding layers formed on upper and lower sides of said tensile strain quantum well active layer,
        wherein the compressive strain quantum well active layer and said tensile strain quantum well active layer is laminated in the vertical direction.

3. The semiconductor laser device of claim 1, wherein said compressive strain quantum well active layer and said tensile strain quantum well active layer are laminated adjacent to each other in the vertical direction.

4. The semiconductor laser device of claim 1, wherein said compressive strain quantum well active layer and said tensile strain quantum well active layer are butt-joined in the radiation direction of the laser beam.

5. The semiconductor laser device of claim 4, further comprising a pair of electrodes configured to apply electric current wherein at least one electrode of the electrode pair is formed to apply electric current to said compressive strain quantum well active layer,
    at least one electrode of the electrode pair is formed to apply electric current to said tensile strain quantum well active layer,
    said electrodes are electrically separated by a separation groove formed on the upper part of a joint region between said compressive strain quantum well active layer and said tensile strain quantum well active layer.

6. The semiconductor laser device of claim 1, wherein said diffraction grating has a diffraction grating length of 300 $\mu$m or less.

7. The semiconductor laser device of claim 1, wherein said diffraction grating has a length equal to or less than a value of (300/1300) times the length of the resonator.

8. The semiconductor laser device of claim 1, wherein the product of a coupling coefficient and a length of said diffraction grating is 0.3 or less.

9. The semiconductor laser device according to claim 1, wherein
    a grating period of said diffraction grating is varied at random or in a predetermined cycle.

10. The semiconductor laser device according to claim 1, wherein the length of the resonator is 800 $\mu$m or more.

11. A semiconductor laser module comprising:
    a semiconductor laser device comprising:
        a compressive strain quantum well active layer;
        a tensile strain quantum well active layer;
        a resonator formed between a radiation end face and a reflection end face of a laser beam; and
        a diffraction grating formed between a radiation end face and a reflection end face of a laser beam, said diffraction grating being positioned in the vicinity of said compressive strain quantum well active layer and/or said tensile strain quantum well active layer, said diffraction grating being configured to select a laser beam having a plurality of oscillation longitudinal modes having a specific central wavelength,
        wherein said compressive strain quantum well active layer and said tensile strain quantum well active layer are arranged so that an output laser beam is obtained by polarization-multiplexing a laser beam in the TE mode generated in said compressive strain quantum well active layer and a laser beam in the TM mode generated in said tensile strain quantum well active layer;
    an optical fiber guiding the laser beam emitted from said semiconductor laser device to the outside; and
    an optical coupling lens system optically coupling said semiconductor laser device and said optical fiber.

12. An optical fiber amplifier comprising:
    an excitation light source comprising:
        a semiconductor laser module comprising:
            a semiconductor laser device comprising:
                a compressive strain quantum well active layer;
                a tensile strain quantum well active layer;
                a resonator formed between a radiation end face and a reflection end face of a laser beam; and
    a diffraction grating formed between a radiation end face and a reflection end face of a laser beam, said diffraction grating being positioned in the vicinity of said compressive strain quantum well active layer and/or said tensile strain quantum well active layer, said diffraction grating being configured to select a laser beam having a plurality of oscillation longitudinal modes having a specific central wavelength, wherein said compressive strain quantum well active layer and said tensile strain quantum well active layer are arranged so that an output laser beam is obtained by polarization-multiplexing a laser beam in the TE mode generated in said compressive strain quantum well active layer and a laser beam in the TM mode generated in said tensile strain quantum well active layer;

an optical fiber guiding the laser beam emitted from said semiconductor laser device to the outside; and an optical coupling lens system optically coupling said semiconductor laser device and said optical fiber.

13. A semiconductor laser device comprising:

a compressive strain quantum well active layer;

a tensile strain quantum well active layer; wherein said compressive strain quantum well active layer and said tensile strain quantum well active layer are arranged so that an output laser beam is obtained by polarization-multiplexing a laser beam in the TE mode generated in said compressive strain quantum well active layer and a laser beam in the TM mode generated in said tensile strain quantum well active layer;

cladding layers formed on upper and lower sides of said compressive strain quantum well active layer;

cladding layers formed on upper and lower sides of said tensile strain quantum well active layer;

a tunnel junction layer formed between one of said cladding layers formed on upper and lower sides of said compressive strain quantum well active layer and one of cladding layers formed on upper and lower sides of said tensile strain quantum well active layer, wherein the compressive strain quantum well active layer and said tensile strain quantum well active layer are laminated in the vertical direction.

* * * * *